(12) United States Patent
Tsuchiya et al.

(10) Patent No.: US 12,237,254 B2
(45) Date of Patent: Feb. 25, 2025

(54) SEMICONDUCTOR DEVICE INCLUDING WIRING SUBSTRATE HAVING MULTIPLE SIGNAL WIRINGS AND MULTIPLE INSULATING LAYERS

(71) Applicant: RENESAS ELECTRONICS CORPORATION, Tokyo (JP)

(72) Inventors: Keita Tsuchiya, Tokyo (JP); Shuuichi Kariyazaki, Tokyo (JP); Kazuhiro Mitamura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 413 days.

(21) Appl. No.: 17/841,196

(22) Filed: Jun. 15, 2022

(65) Prior Publication Data

US 2023/0066512 A1 Mar. 2, 2023

(30) Foreign Application Priority Data

Aug. 31, 2021 (JP) ................. 2021-140945

(51) Int. Cl.
*H01L 23/498* (2006.01)
*H01L 23/14* (2006.01)
(Continued)

(52) U.S. Cl.
CPC ........ *H01L 23/49822* (2013.01); *H01L 23/14* (2013.01); *H01L 23/36* (2013.01);
(Continued)

(58) Field of Classification Search
CPC ....... H01L 23/12; H01L 23/14; H01L 23/142; H01L 23/34; H01L 23/36; H01L 23/367; H01L 23/3675; H01L 23/48; H01L 23/49822; H01L 23/49827; H01L 23/49838; H01L 23/522; H01L 23/5226; H01L 23/64; H01L 23/66; H01L 2223/6627; H01P 3/08; H01P 5/028
See application file for complete search history.

(56) References Cited

U.S. PATENT DOCUMENTS 11,158,617 B2 10/2021 Akiba et al.
2020/0006303 A1* 1/2020 Akiba ............... H01L 23/49822

FOREIGN PATENT DOCUMENTS

JP 2010-245439 A 10/2010
JP 2020-004821 A 1/2020

* cited by examiner

*Primary Examiner* — Cheung Lee
(74) *Attorney, Agent, or Firm* — Rimon P.C.

(57) ABSTRACT

A wiring substrate includes: a first insulating layer; a ground plane formed on the first insulating layer; a second insulating layer formed on the first insulating layer such that the ground plane is covered with the second insulating layer; a first signal wiring formed on the second insulating layer; a third insulating layer formed on the second insulating layer such that the first signal wiring is covered with the third insulating layer; and a second signal wiring formed on the third insulating layer and electrically connected with the first signal wiring. The first signal wiring is arranged in a region overlapping with a portion of a heat radiating plate. The second signal wiring is not arranged in the region. The ground plane has an opening portion located at a position overlapping with the first signal wiring. The opening portion is formed so as to extend along the first signal wiring.

10 Claims, 18 Drawing Sheets

(51) Int. Cl.
  *H01L 23/36* (2006.01)
  *H01L 23/367* (2006.01)
  *H01L 23/66* (2006.01)
  *H01P 3/08* (2006.01)
(52) U.S. Cl.
  CPC .... *H01L 23/3675* (2013.01); *H01L 23/49838* (2013.01); *H01L 23/66* (2013.01); *H01P 3/08* (2013.01); *H01L 2223/6627* (2013.01)

SEMICONDUCTOR DEVICE INCLUDING WIRING SUBSTRATE HAVING MULTIPLE SIGNAL WIRINGS AND MULTIPLE INSULATING LAYERS

CROSS-REFERENCE TO RELATED APPLICATIONS

The disclosure of Japanese Patent Application No. 2021-140945 filed on Aug. 31, 2021 including the specification, drawings and abstract is incorporated herein by reference in its entirety.

BACKGROUND

The present invention relates to a semiconductor device. Here, there are disclosed techniques listed below.
[Patent Document 1] Japanese Unexamined Patent Application Publication No. 2010-245439
[Patent Document 2] Japanese Unexamined Patent Application Publication No. 2020-4821

In a semiconductor device that a semiconductor chip is mounted on the wiring substrate, there is a semiconductor device that a heat radiating plate (stiffener ring) covering a semiconductor chip is bonded to the wiring substrate (for example, see Patent Document 1). Also, Patent Document 2 discloses a semiconductor device that a lid is bonded to a wiring substrate via an adhesive layer having a conductivity and a reference potential is to be applied to the lid.

SUMMARY

As an index of a performance assessment for a semiconductor device, there are a reliability of a signal transmission, increasing of a signal transmission speed, downsizing of a size of a product, simplifying a structure of a wiring substrate or the like. For example, from the viewpoint of reducing the number of wiring layers provided in the wiring substrate, it is preferable to utilize the wiring layer in the uppermost layer as an arrangement space of a signal wiring. However, in case of a semiconductor device that the heat radiating plate is bonded to the wiring substrate, from the viewpoint of avoiding a disconnection risk of a wiring due to a temperature cycle load, it is preferable that the signal wiring is not arranged immediately below a region to where the heat radiating plate is bonded. In this case, it is required to lay the signal wiring out through a plurality of wiring layers. However, in case of this structure that one signal wiring is formed in different wiring layers from each other, there is a possibility that an impedance of the signal transmission path may be discontinuous due to the difference of a wiring structure.

Other objects and novel features will become apparent from the description of this specification and the accompanying drawings.

A semiconductor device according to one embodiment, including: a semiconductor chip having a first surface on which a first electrode is arranged, the first electrode being a transmission path of a first signal; a wiring substrate having a second surface facing the first surface of the semiconductor chip; and a heat radiating plate disposed on the wiring substrate such that the semiconductor chip is covered with the heat radiating plate. Here, the heat radiating plate has: a first portion including a portion overlapping with the semiconductor chip; and a second portion arranged around the first portion and bonded to the wiring substrate via an adhesive layer. Also, the wiring substrate includes: a first insulating layer; a first conductive pattern formed on the first insulating layer and to which a first potential is to be supplied; a second insulating layer contacted with the first conductive pattern and formed on the first insulating layer such that the first conductive pattern is covered with the second insulating layer; a first signal wiring formed on the second insulating layer; a third insulating layer contacted with the first signal wiring and formed on the second insulating layer such that the first signal wiring is covered with the third insulating layer; a second signal wiring formed on the third insulating layer and electrically connected with each of the first signal wiring and the first electrode; and an organic insulating film contacted with the second signal wiring and formed on the third insulating layer such that the second signal wiring is covered with the organic insulating film. The first signal wiring is arranged in a region overlapping with the second portion of the heat radiating plate, while the second signal wiring is not arranged in the region overlapping with the second portion of the heat radiating plate. The first conductive pattern has a first opening portion located at a position overlapping with the first signal wiring. Also, the first opening portion is formed so as to extend along the first signal wiring.

According to the above one embodiment, it is possible to improve the performance of the semiconductor device.

Figure 1:
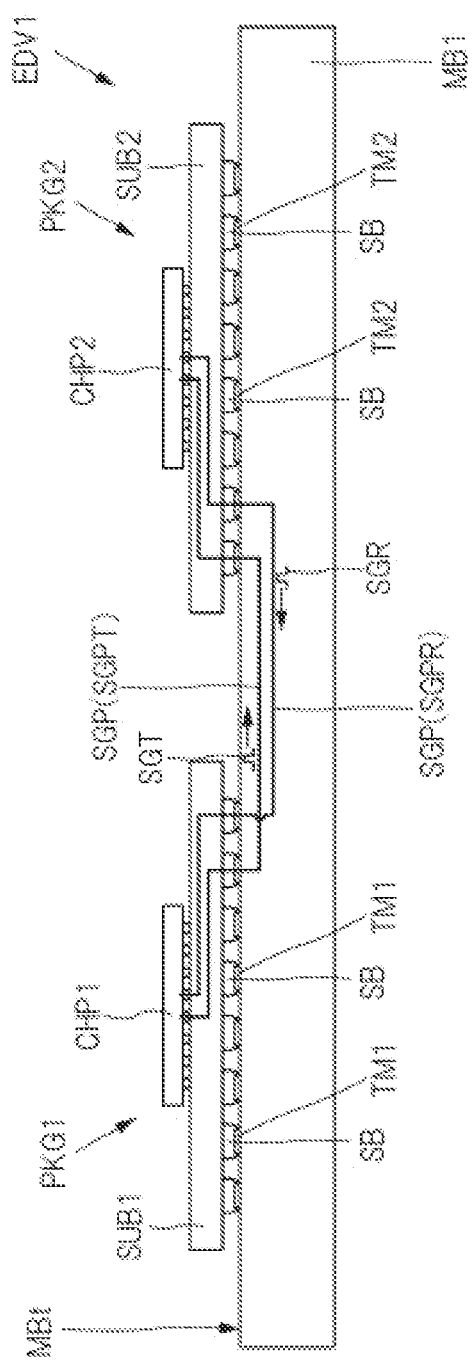
FIG. 1 is an explanatory view showing a configuration example of an electronic device including a semiconductor device according to one embodiment.

DETAILED DESCRIPTION (Descriptions of Form, Basic Term, and Usage in Present Application)

In the present application, the description of the embodiment will be divided into a plurality of sections or the like as required for convenience, but unless expressly stated otherwise, these are not independent of each other, and each part of a single example, one of which is a partial detail or a part or all of the other, whether before or after the description, or the like, is modified example or the like. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, the term "silicon member" or the like is not limited to pure silicon, and it is needless to say that it also includes a member containing a SiGe (silicon-germanium) alloy, a multi-element alloy containing silicon as its main component, other additives, or the like. In addition, the term gold plating, Cu layer, nickel plating, or the like includes not only pure components, but also members containing gold, Cu, nickel, or the like as main components, except when it is clearly stated that this is not the case.

In addition, reference to a specific numerical value or quantity may be greater than or less than that specific numerical value, unless expressly stated otherwise, theoretically limited to that number, and obviously not so from the context.

In the drawings of the embodiments, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching or dot patterns may be added to indicate that the region is not a void even if it is not a cross-section or to indicate the boundary of the area.

In the following description, the terms ground plane or power plane may be used. Ground plane and the power supply plane is a conductor pattern of a large area shape is different from the so-called wiring pattern. Of the conductor patterns of large area, what the reference potential is to be supplied is referred to as a ground plane, what the power supply potential is to be supplied is referred to as a power supply plane.

<Electronic Device>

Figure 2:
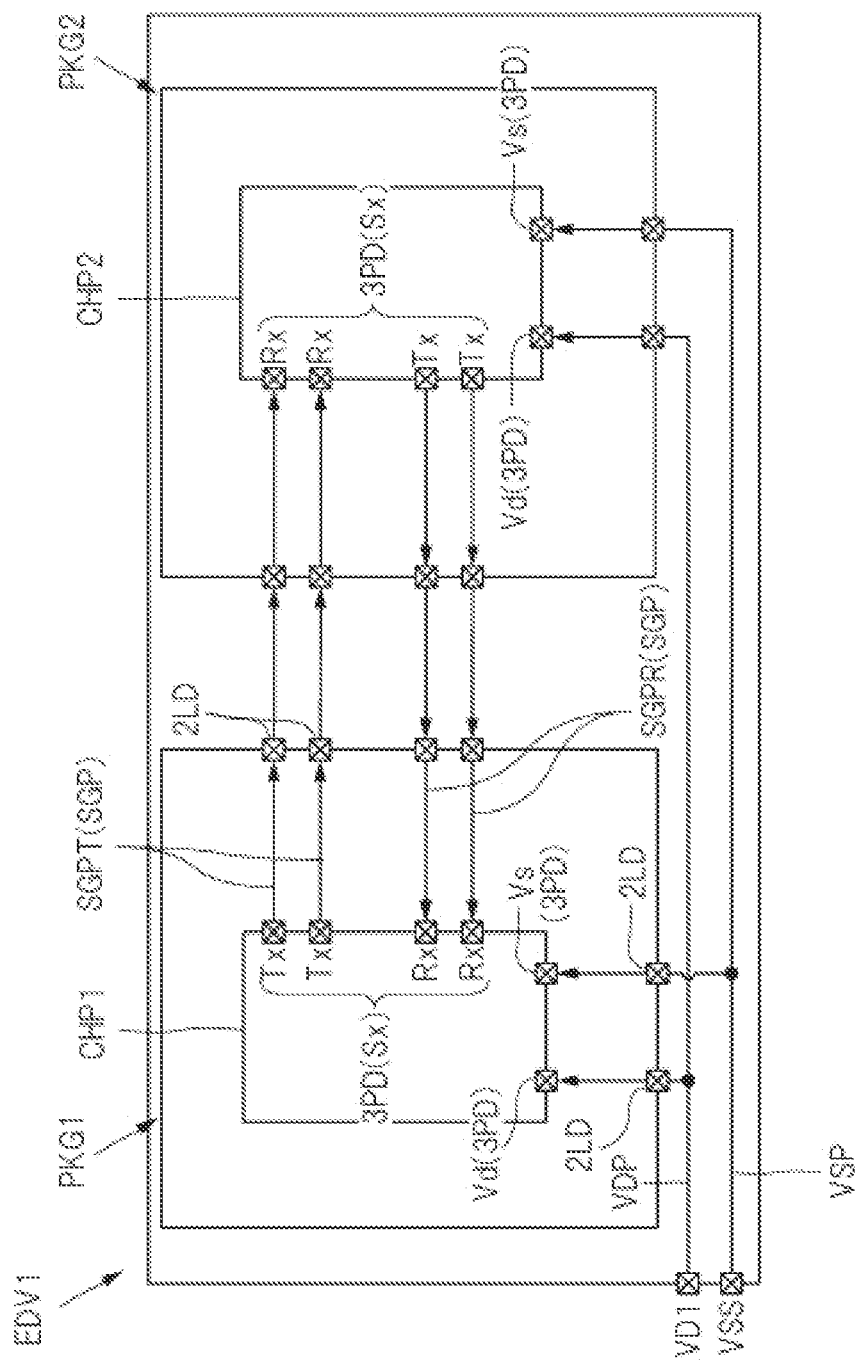
FIG. 2 is an explanatory view showing a configuration example of a circuit of the electronic device shown in FIG. 1.

First, with reference to FIGS. 1 and 2, illustrating the use of semiconductor device of the present embodiment described below. FIG. 1 is an explanatory view showing a configuration example of an electronic device including a semiconductor device of the present embodiment. Also, FIG. 2 is an explanatory view showing a configuration example of a circuit of the electronic device shown in FIG. 1. Incidentally, in order to explicitly indicate that the semiconductor device PKG1 and the semiconductor device PKG2 are electrically connected, FIG. 1 schematically shows the signal transmission path SGP shown in FIG. 2 by a solid line.

The electronic device (electronics) EDV1 shown in FIG. 1 has a wiring substrate (motherboard, mounting substrate) MB1 and the semiconductor devices PKG1 and PKG2 mounted on the wiring substrate MB1. The semiconductor device PKG1 and the semiconductor device PKG2 are electrically connected to each other via a signal transmission path SGP formed in the wiring substrate MB1. The signal transmitted through the signal transmission path SGP includes a signal SGT output from the semiconductor device PKG1 and a signal SGR input to the semiconductor device PKG1. Also, the signal transmission path SGP includes a signal transmission path SGPT onto which the signal SGT is transmitted, and a signal transmission path SGPR onto which the signal SGR is transmitted.

In an example shown in FIG. 1, the signal SGT is output from the semiconductor device PKG1 and is input to the semiconductor device PKG2. Also, the signal SGR is output from the semiconductor device PKG2 and is input to the semiconductor device PKG1. However, the output destination of the signal SGT and the output source of the signal SGR are not limited to the example shown in FIG. 1, and there are various modified examples. Since the semiconductor device PKG1 and the semiconductor device PKG2 shown in FIG. 1 have the similar structure as each other, the semiconductor device PKG1 will be described below as a typical example.

As shown in FIG. 2, the electronic device EDV1 has a plurality of signal transmission paths SGP. Signal transmission path SGP, for example, a signal is transmitted at a transmission rate above 15 Gbps (Gigabit per second), a high-speed transmission path (high-speed signal transmission path). Incidentally, when realizing the transmission rate of 15 Gbps by one signal transmission path, for example, the frequency of the electric signal flowing through the signal transmission path SGP is required to be 30 GHZ (gigahertz) or more. Further, in the present embodiment, as an example of a signal transmission path SGP is a high-speed transmission path, different signals are transmitted to each of the plurality of signal transmission path SGP, so-called, will be described taking a transmission path of the single-ended structure. However, the technique described below transmits one signal via a pair of signal transmission paths composing the differential pair, it can also be applied to the transmission path of the differential system. Embodiments corresponding to differential transmission paths will be described later as modified example.

As shown in FIG. 2, the semiconductor chip (semiconductor component, electronic component) CHP1 of the semiconductor device PKG1 includes a plurality of electrodes (electrode terminals). The plurality of electrodes of the semiconductor chip CHP1 includes a signal electrode (signal electrode terminal) Tx onto which the signal SGT (see FIG. 1) which is an output signal (transmission signal) is to be transmitted. Also, the plurality of electrodes of the semiconductor chip CHP1 includes a signal electrode (signal electrode terminal) Rx onto which the signal SGR (see FIG. 1) which is an input signal (received signal) is to be transmitted. In the following, a signal electrode Sx may be described as a generic name of the signal electrode Tx or the signal electrode Rx.

In FIG. 2, among the plurality of signal transmission paths SGP provided in the semiconductor device PKG1, two output signal transmission paths SGPT and two input signal transmission paths SGPR are typically shown. However, the number of the signal transmission paths SGP included in the semiconductor device PKG1 is larger than the number of the signal transmission paths shown in FIG. 2.

Further, a plurality of electrodes of the semiconductor chip CHP1 includes an electrode (reference potential electrode, first potential electrode) Vs to which a reference potential (first potential) VSS is to be supplied, an electrode (power supply potential electrode, second potential electrode) Vd to which a power supply potential (second potential) VDD is to be supplied. The electrode Vs composes a part of the reference potential supplying path VSP. The electrode Vd composes a part of the power supply potential supplying path VDP. The power supply potential VDD is to be supplied to the semiconductor chip CHP1 (specifically, the circuit provided in the semiconductor chip CHP1) via the electrode Vd. Also, the reference potential VSS is to be supplied to the semiconductor chip CHP1 (specifically, the circuit provided in the semiconductor chip CHP1) via the electrode Vs. At least a part of the plurality of circuits provided in the semiconductor chip CHP1 is driven by a driving voltage generated by the potential difference between the power supply potential VDD and the reference potential VSS. The reference potential VSS is, for example, a ground potential. Also, the power supply potential VDD is higher than the reference potential VSS.

<Semiconductor Device>

Figure 3:
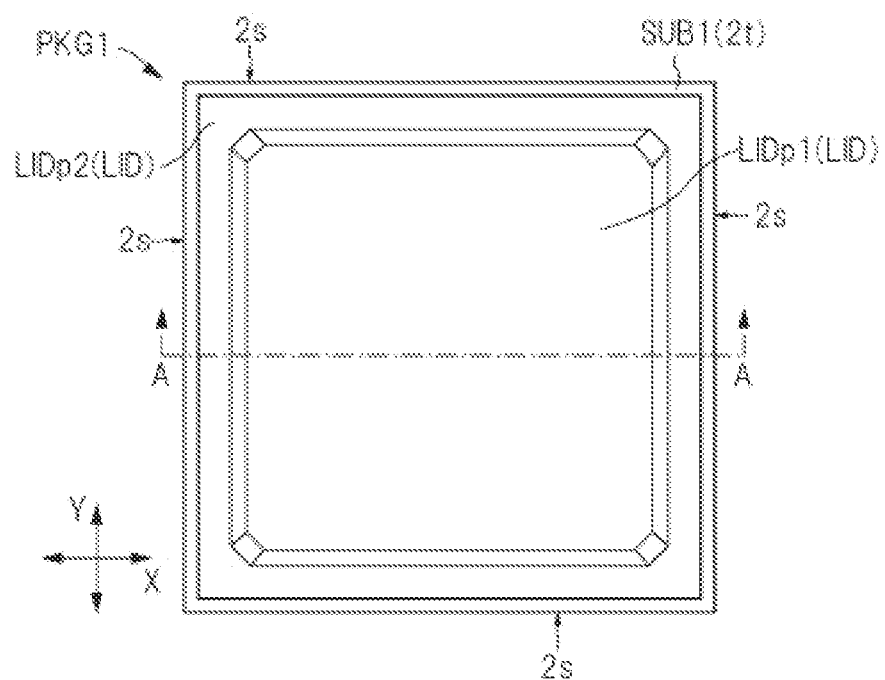
FIG. 3 is an upper surface view of one of two semiconductor devices shown in FIG. 1.
Figure 4:
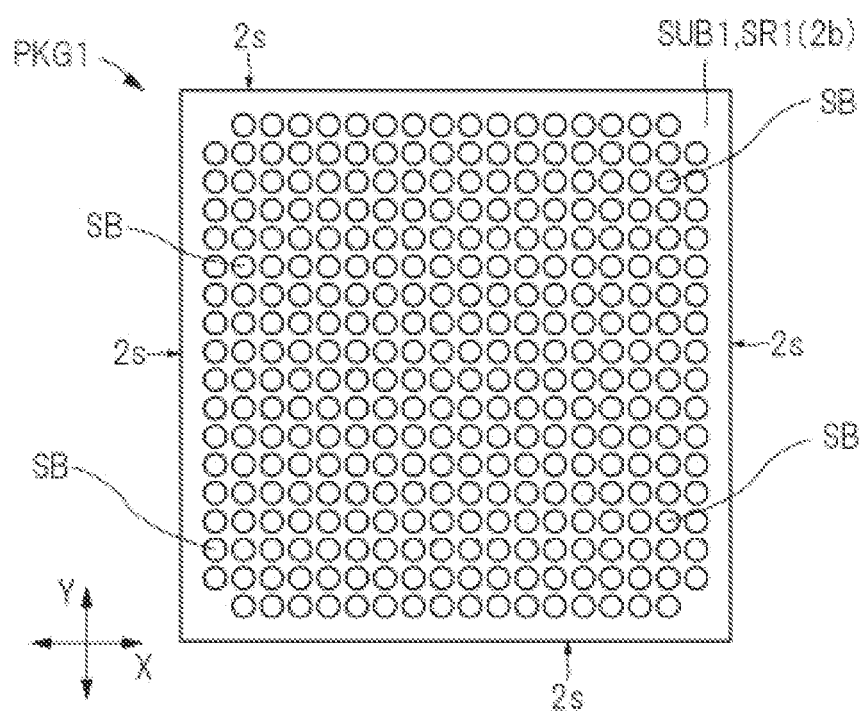
FIG. 4 is a lower surface view of the semiconductor device shown in FIG. 3.
Figure 5:
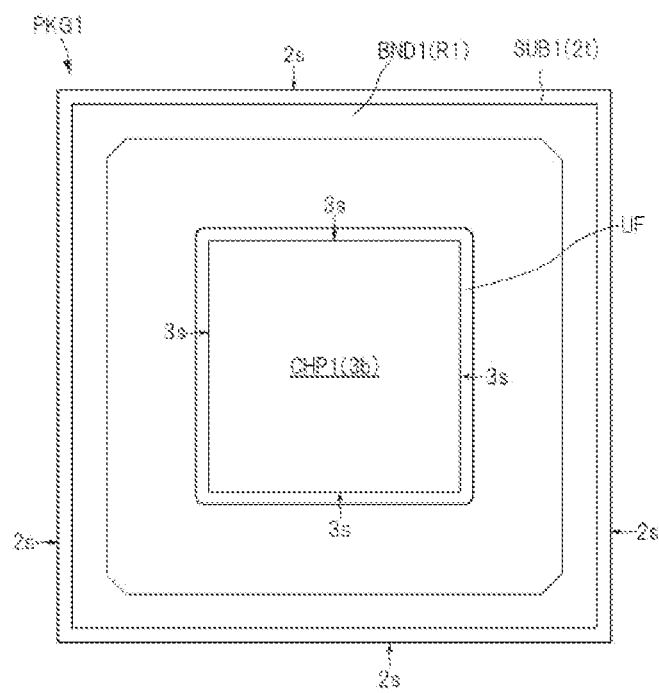
FIG. 5 is a plan view in such a state that the heat radiating plate composing the semiconductor device shown in FIG. 3 is removed.

FIG. 3 is an upper surface view of one of two semiconductor devices shown in FIG. 1. FIG. 4 is a lower surface view of the semiconductor device shown in FIG. 3. FIG. 5 is a plan view in such a state that the heat radiating plate composing the semiconductor device shown in FIG. 3 is removed. Also, FIG. 6 is a cross-sectional view along line A-A shown in FIG. 3.

The semiconductor device PKG1 of the present embodiment has a wiring substrate SUB1, and a semiconductor chip CHP1 (see FIG. 5) mounted on the wiring substrate SUB1. Also, the semiconductor device PKG1 has a heat radiating adhesive sheet TIM disposed on the semiconductor chip CHP1, and a heat radiating plate LID covering the entire semiconductor chip CHP1, the entire heat radiating adhesive sheet TIM, and part of the wiring substrate SUB1.

In case of the semiconductor package performing a signal transmission at high speed like the semiconductor device PKG1, the heating value of the semiconductor chip CHP1 tends to increase with increasing power dissipation. On the other hand, from the viewpoint of stabilizing the operation of the semiconductor chip CHP1, it is preferable that the temperature of the semiconductor chip CHP1 is not excessively increased. Therefore, it is preferable to efficiently discharge the heat generated in the semiconductor chip CHP1 to the outside. In case of the semiconductor device PKG1, since the semiconductor chip CHP1 is thermally connected with the heat radiating plate LID via the heat radiating adhesive sheet TIM, it is possible to improve the emission properties of heat generated in the semiconductor chip CHP1.

Figure 6:
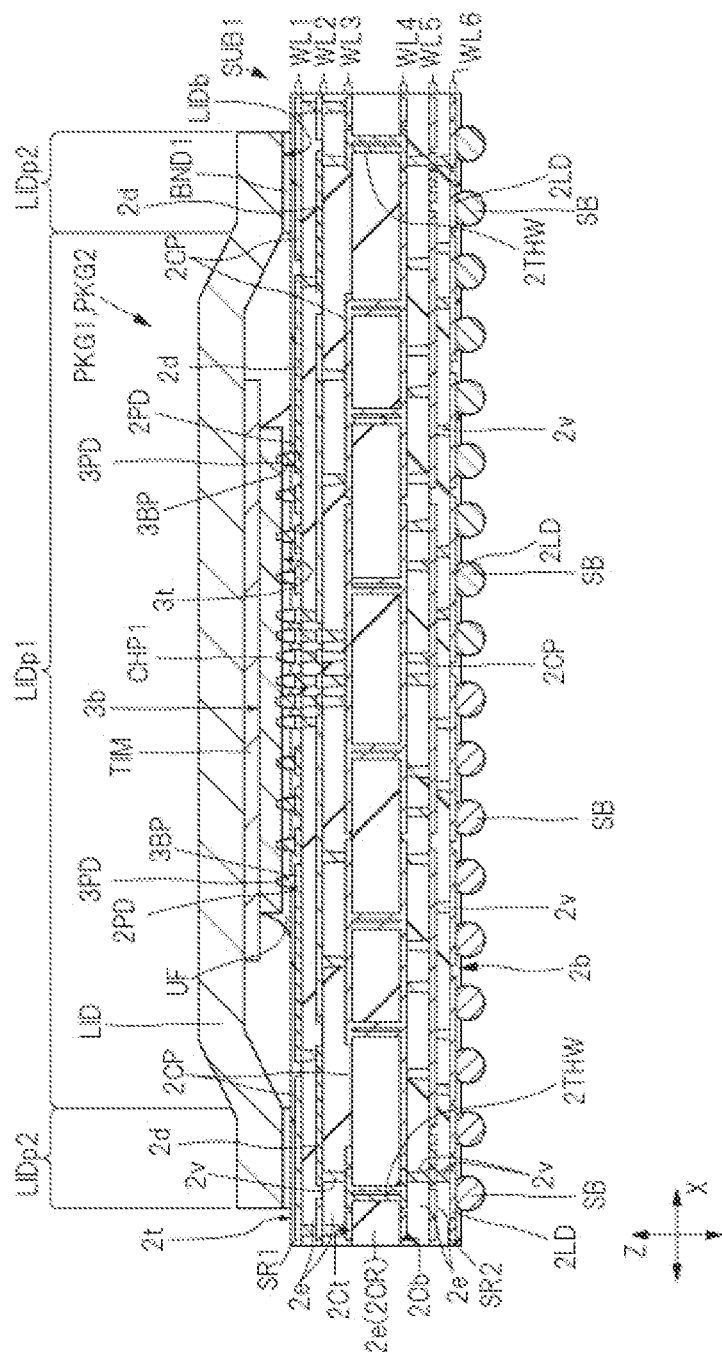
FIG. 6 is a cross-sectional view along line A-A shown in FIG. 3.

As shown in FIG. 6, the heat radiating plate LID is bonded (fixed, adhered) to the wiring substrate SUB1 via an adhesive layer BND1. The heat radiating plate LID includes a portion (central portion) LIDp1 overlapping with the semiconductor chip CHP1, and a portion (peripheral portion) LIDp2 arranged around the portion LIDp1 and bonded to the wiring substrate SUB1 via the adhesive layer BND1. By bonding the heat radiating plate LID not only the semiconductor chip CHP1 but also to the wiring substrate SUB1, it is possible to firmly fix the heat radiating plate LID. The portion (peripheral part) LIDp2 is defined as a portion overlapping with the adhesive layer BND1 in the thickness direction (Z direction shown in FIG. 6) of the wiring substrate SUB1. The portion LIDp2 includes an adherend surface LIDb adhered to the adhesive layer BND1.

The wiring substrate SUB1 has an upper surface (surface, main surface, chip mounting surface) which the semiconductor chip CHP1 is mounted, a lower surface (surface, main surface, mounting surface) $2b$ opposite the upper surface $2t$. Also, the wiring substrate SUB1 has a plurality of side surfaces $2s$ continuous to the respective outer edges of the upper surface $2t$ (see FIG. 3) and the lower surface $2b$ (see FIG. 4). For the present embodiment, each of the upper surface $2t$ (see FIG. 3) of the wiring substrate SUB1 and the lower surface $2b$ (see FIG. 4) of the wiring substrate SUB1 is comprised of square (rectangular) shape. The upper surface $2t$ is a chip mounting surface facing the front surface $3t$ of the semiconductor chip CHP 1.

The wiring substrate SUB1 has a plurality of wiring layers (6 layers in an example shown in FIG. 6) WL1, WL2, WL3, WL4, WL5 and WL6 for electrically connecting a terminal (pad 2PD) of the upper surface $2t$, which is a chip mounting surface, and a terminal (land 2LD) of the lower surface $2b$, which is a mounting surface. Each wiring layer is located between the upper surface $2t$ and the lower surface $2b$. Each wiring layer has a conductor pattern, such as wiring, that is a path for supplying electronic signal or power. Also, an insulating layer $2e$ is disposed between the wiring layers. The wiring layers are electrically connected with each other via a via wiring $2v$, which is an interlayer conductive path penetrating through the insulating layer $2e$, or a through-hole wiring 2THW. In the present embodiment, the wiring substrate having six wiring layers therein is exemplified as an example of the wiring substrate SUB1, but the number of wiring layers provided in the wiring substrate SUB1 is not limited to six layers. For example, a wiring substrate having five or less layers or seven or more layers of wiring layers can be used as modified example.

Further, among the plurality of wiring layers, the wiring layer WL1 arranged in the uppermost layer is covered with the organic insulating film SR1. An opening portion is provided in the organic insulating film SR1, and a plurality of pad WL1 provided in the wiring layer 2PD is exposed from the organic insulating film SR1 at the opening portion. Also, among the plurality of wiring layers, a plurality of land 2LD is provided in the wiring layer WL6 arranged in the lowermost layer. The wiring layer WL6 is covered with the organic insulating film SR2. Each of the organic insulating film SR1 and the organic insulating film SR2 is a solder resist film. The plurality of pads 2PD provided in the wiring layer WL1 and the plurality of land 2LD provided in the wiring layer WL6 are electrically connected with each other via the conductor pattern (wiring $2d$ or conductor pattern 2CP of large area) formed on the respective wiring layer provided in the wiring substrate SUB1, the via wiring $2v$, and the through-hole wiring 2THW, respectively.

Each of the wiring $2d$, the pad 2PD, the via wiring $2v$, the via land $2vL$ (see FIG. 7 to be described later), the through-hole land THL (see FIG. 7 to be described later), the through-hole wiring 2THW, the land 2LD, and the conductor pattern 2CP is made of, for example, copper or a metallic material comprised of copper as a main component.

Further, the wiring substrate SUB1 is, for example, formed by stacking (laminating) the plurality of wiring layers by a build-up method on each of the upper surface 2Ct and the lower surface 2Cb of the insulating layer (core material, core insulating layer) 2CR made of prepreg impregnated a glass fiber with a resin. Also, the wiring layer WL3 on the upper surface 2Ct of the wiring layer 2CR and the wiring layer WL4 on the lower surface 2Cb of the wiring layer 2CR are electrically connected with each other via a plurality of through-hole wiring 2THW, which is embedded in a plurality of through-holes provided so as to penetrate through the insulating layer 2CR from one of the upper surface 2Ct and the lower surface 2Cb to the other.

In an example shown in FIG. 6, the wiring substrate SUB1 shows a wiring substrate in which the plurality of wiring layers is stacked on both sides of the upper surface 2Ct of the insulating layer 2CR, which is a core material, and the lower surface 2Cb of the insulating layer 2CR. However, as a modified example with regard to FIG. 6, a so-called coreless substrate that has no insulating layer 2CR made of a hard material such as prepreg material, and that is formed by stacking (laminating) an insulating layer 2e and a conductive pattern such as the wiring 2d in order, may be used. When the coreless substrate is used, the through-hole wire 2THW is not formed, and each wiring layer is electrically connected with each other via the via wiring 2v.

Further, in the example shown in FIG. 6, solder balls (solder material, external terminals, electrodes, external electrodes) SB are connected to each of the plurality of lands 2LD. The solder balls SB are a conductive member for electrically connecting a plurality of terminals of the motherboard (not shown) with the plurality of lands 2LD, when mounting the semiconductor device PK G1 on the motherboard (not shown). Each solder ball SB is, for example, a Sn—Pb solder material containing lead (Pb), or a solder material not substantially containing lead (Pb), which is a so-called lead-free solder (Pb-free solder). As an example of the lead-free solder is, for example, tin (Sn) only, tin-bismuth (Sn—Bi), tin-copper-silver (Sn—Cu—Ag), tin-copper (Sn—Cu), or the like. Here, the lead-free solder means a solder in which the content of lead (Pb) is 0.1 wt % or less, and this content is determined as a standard of RoHS (Restriction of Hazardous Substances) command.

Further, as shown in FIG. 4, a plurality of solder balls SB is arranged in a matrix (array shape, matrix shape). Although not shown in FIG. 4, a plurality of lands 2LD (see FIG. 6) to which a plurality of solder balls SB is connected is also arranged in a matrix. Thus, a semiconductor device in which a plurality of external terminals (solder balls SB, land 2LD) is arranged in a matrix on the mounting surface of the wiring substrate SUB1 is called an area array type semiconductor device. In case of the area array type semiconductor device, since the mounting surface (lower surface 2b) of the wiring substrate SUB1 can be utilized as an arrangement space of the external terminal, it is possible to suppress an increase of the mounting area of the semiconductor device, even if the number of the external terminals is increased. In other words, it is possible to mount a semiconductor device in which the number of external terminals is increased in accordance with an increase of the function and high integration, without increasing a space for mounting.

Further, the semiconductor device PKG1 includes a semiconductor chip CHP1 mounted on the wiring substrate SUB1. As shown in FIG. 6, the semiconductor chip CHP1 has a front surface (main surface, upper surface) 3t on which a plurality of protruding electrodes 3BP is arranged, and the back surface (main surface, the lower surface) 3b opposite the front surface 3t. The semiconductor chip CHP1 has a plurality of side surfaces 3s intersecting with each of the front surface 3t and the back surface 3b. The semiconductor chip CHP1 is comprised of a square (rectangular) shape having a smaller planar area than the wiring substrate SUB1 in plan view as shown in FIG. 5. In an example shown in FIG. 5, the semiconductor chip CHP1 is mounted in the central portion of the upper surface 2t of the wiring substrate SUB1, and the four side surfaces 3s of the semiconductor chip CHP1 extends along the four side surfaces 2s of the wiring substrate SUB1, respectively.

Further, a plurality of electrodes (pads, electrode pads, bonding pads) 3PD is formed on the front surface 3t of the semiconductor chip CHP1. In the example shown in FIG. 6, the semiconductor chip CHP1 is mounted on the wiring substrate SUB1 in such a state that the surface 3t faces the upper surface 2t of the wiring substrate SUB1. Such a mounting method is called a face-down mounting method or a flip-chip connection method.

Although not shown, a plurality of semiconductor elements (circuit elements) is formed in the main surface (specifically, a semiconductor element forming region provided on an element forming surface of a semiconductor substrate which is a base material of the semiconductor chip CHP1) of the semiconductor chip CHP1. A plurality of electrodes 3PD is electrically connected with the plurality of semiconductor elements, respectively, via a wiring (not shown) formed in a wiring layer provided in an inside (specifically, between the front surface 3t and the semiconductor element forming region not shown) of the semiconductor chip CHP1.

The semiconductor chip CHP1 (specifically, the base material of the semiconductor chip CHP1) is made of, for example, silicon (Si). Also, an insulating film covering the base material of the semiconductor chip CHP1 and a wiring is formed on the front surface 3t, and a part of each of the plurality of electrodes 3PD is exposed from the passivation film at an opening portion formed in the passivation film. In addition, each of the plurality of electrodes 3PD is made of a metal, and, for example, is made of aluminum (Al) in the present embodiment.

Further, as shown in FIG. 6, each of the protruding electrode 3PD to the plurality of electrode 3BP is connected, a plurality of electrode 3PD of the semiconductor chip CHP1, the plurality of pad substrate SUB1 through a plurality of protruding electrode 3BP, are electrically connected, respectively. Projecting electrode (bump electrode) 3BP is a metal member formed so as to protrude on the surface 3t of the semiconductor chip CHP1 (conductive member). In the present embodiment, the protruding electrode 3BP has a structure in which a pillar electrode made of copper, for example, is formed on an electrode 3PD, and a solder material is laminated on the tip of the columnar electrode. As the solder material laminated on the tip of the columnar electrode, a solder material containing lead or a lead-free solder can be used, similarly to the above-described solder ball SB.

When mounting the semiconductor chip CHP1 to the wiring substrate SUB1, good bonding material bonding between the solder to a plurality of pad 2PD (e.g., base metal film or solder paste) is formed in advance. By performing heat treatment (reflow process) while contacting the solder material at the end of the columnar electrode and the bonding material on the pad 2PD, the solder is integrated, the protruding electrode 3BP is formed. Further, as modified example for the present embodiment, columnar electrodes made of nickel (Ni), or micro-solder balls are formed through the underlayer metal film on the electrode 3PD, the so-called solder bumps may be used as the protruding electrode 3BP.

Further, between the semiconductor chip CHP1 and the wiring substrate SUB1 as shown in FIG. 6, underfill resin (insulating resin) UF is disposed. Underfill resin UF is disposed so as to close the space between upper surface 2t of the surface 3t and the wiring substrate SUB1 of the semiconductor chip CHP1. Each of the plurality of protrusion electrodes 3BP is sealed with the underfill resin UF. Further, the underfill resin UF is made of an insulating (non-conductive) material (e.g., a resin material), is disposed so as to seal the electrical connecting portion of the semiconductor chip CHP1 and the wiring substrate SUB1 (junction of the plurality of protruding electrode 3BP). Thus, by covering the junction between the plurality of protruding electrode 3BP and the plurality of pad 2PD with an underfill resin UF, it is possible to alleviate the stresses occurring in the electrically connecting portion of the semiconductor chip CHP1 and the wiring substrate SUB1. Further, it is possible to alleviate the stresses occurring at the junction between the plurality of electrode 3PD and the plurality of protruding electrode 3BP of the semiconductor chip CHP1. Furthermore, it is also possible to protect the main surface of the semiconductor device of the semiconductor chip CHP1 (circuit elements) is formed.

Further, on the back surface 3b of the semiconductor chip CHP1, the heat radiating plate (lid, heat spreader, heat radiating member) LID is disposed. The heat radiating plate LID, for example, a metal plate having a higher thermal conductivity than the wiring substrate SUB1, and a function of discharging heat generated in the semiconductor chip CHP1 to the outside. Further, the heat radiating plate LID is thermally connected to the semiconductor chip CHP1 via the heat radiating adhesive sheet TIM. The heat radiating adhesive sheet TIM is in contact with each of the semiconductor chip CHP1 and the heat radiating plate LID.

<Layout of Signal Wiring>

Figure 7:
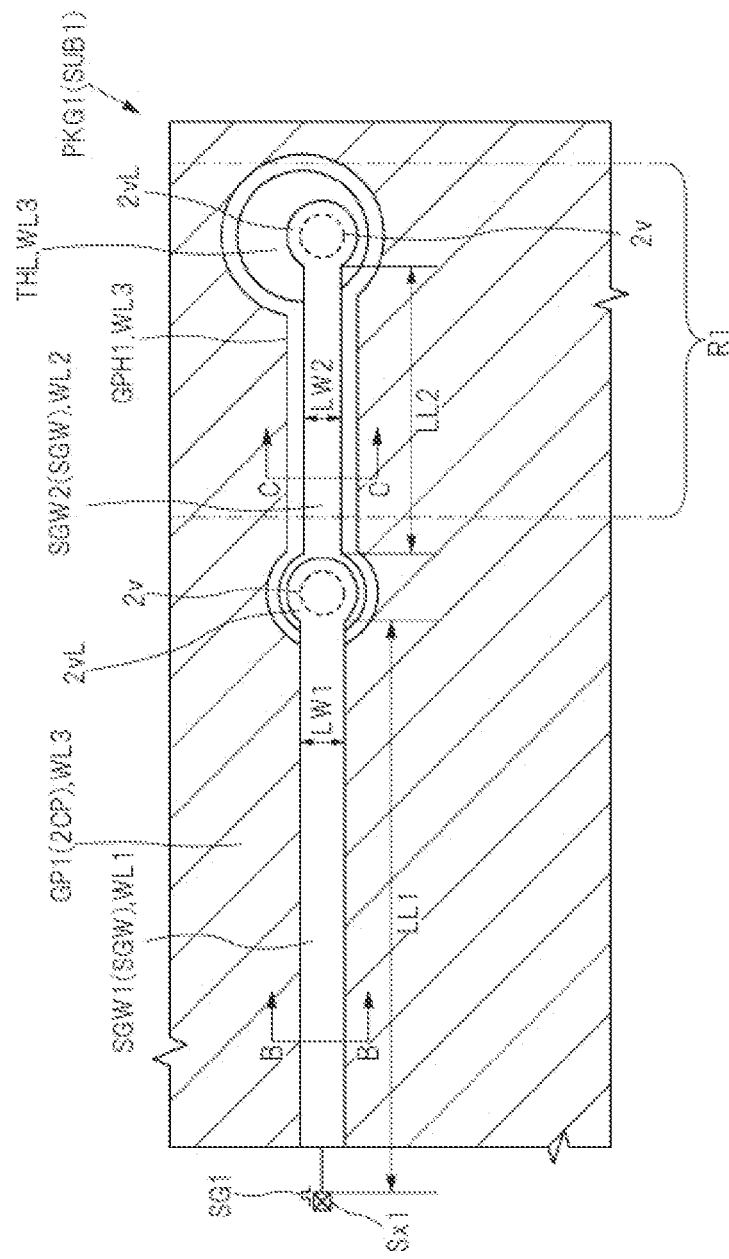
FIG. 7 is a transparent plan view showing an example of a layout of a signal wiring provided in a wiring substrate shown in FIG. 6.
Figure 8:
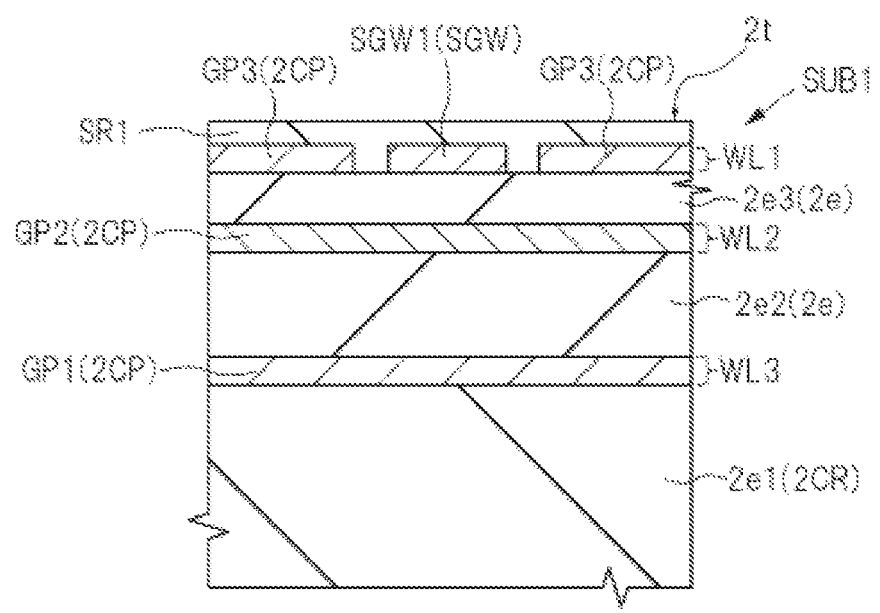
FIG. 8 is an enlarged cross-sectional view along line B-B shown in FIG. 7.
Figure 9:
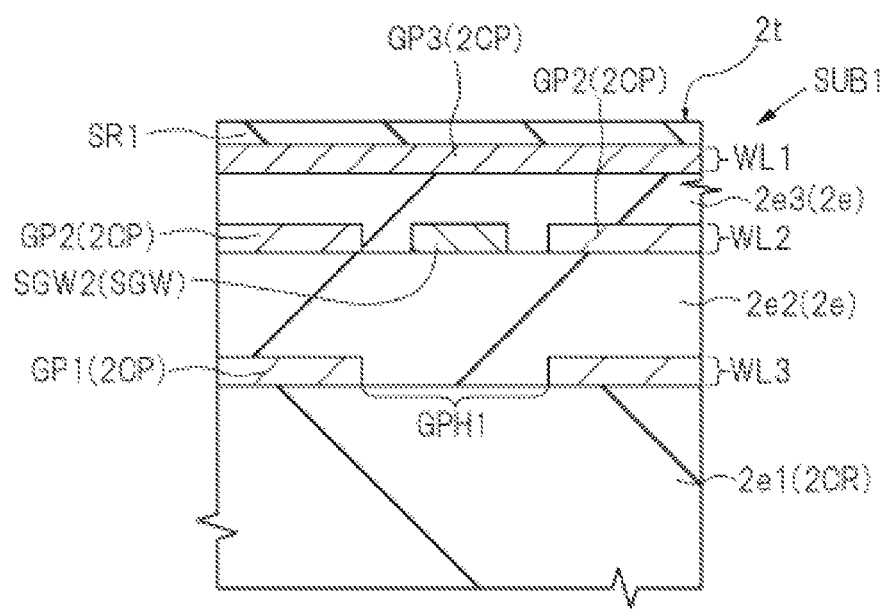
FIG. 9 is an enlarged cross-sectional view along line C-C shown in FIG. 7.
Figure 10:
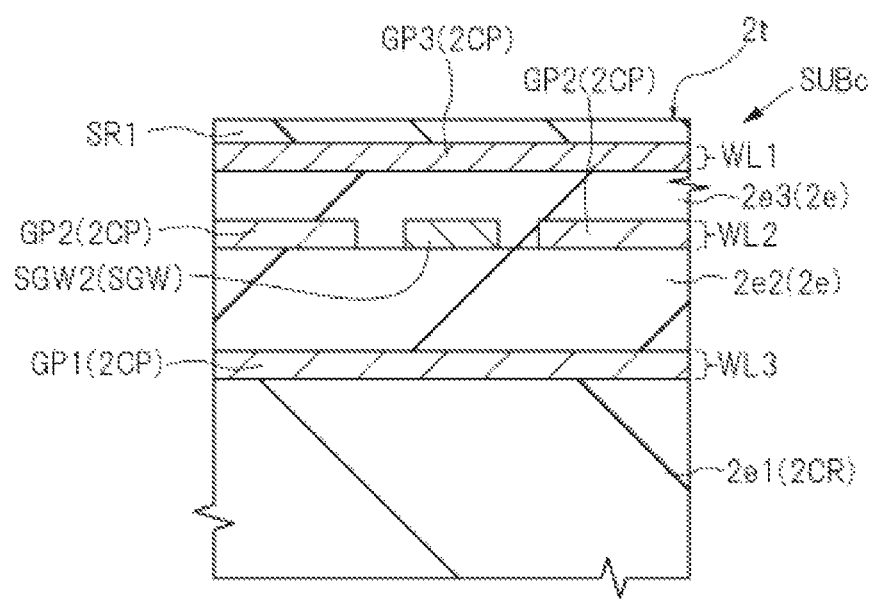
FIG. 10 is an enlarged cross-sectional view showing an examined example with regard to FIG. 9.

Next, a description will be given of a layout of the signal wiring of the wiring substrate SUB1 of the semiconductor device PKG1 of the present embodiment. The semiconductor device PKG1 includes a plurality of signal transmission paths, and will be described below by taking one of the plurality of signal transmission paths. FIG. 7 is a transparent plan view showing an example of a layout of a signal wiring provided in a wiring substrate shown in FIG. 6. FIG. 8 is an enlarged cross-sectional view along line B-B shown in FIG. 7. FIG. 9 is an enlarged cross-sectional view along line C-C shown in FIG. 7. FIG. 10 is an enlarged cross-sectional view showing an examined example with regard to FIG. 9. In FIG. 7, in order to facilitate viewing the respective planar positional relationship among the signal wiring SGW1 formed in the wiring layer WL1, the signal wiring SGW2 formed in the wiring layer WL2, and the ground plane GP1 formed in the wiring layer WL3, it is a transparent plan view without showing a pattern and an insulating layer other than the forementioned signal wirings SGW1, SGW2, the through-hole land THL formed in the wiring layer WL3 and the ground plane GP1. In the transparent plan view, the region R1 shown by the two-dot chain line in FIG. 7 is an area overlapping with the portion LIDp2 of the heat radiating plate LID shown in FIG. 6. Incidentally, FIG. 11 to be described later, FIG. 14, and also illustrates a region R1 in FIG. 18, these also mean a region overlapping the portion LIDp2 of the heat radiating plate LID in the transparent plan view in the same manner.

In the explanation of the present embodiment, the expression that "A" overlaps "B" in a transparent plan view may be used. This means that "A" and "B" overlap in the Z direction shown in FIG. 6. Therefore, the expression that "A" overlaps "B" in the transparent plan view can be replaced with the expression that "A" overlaps "B" in the thickness direction of the wiring substrate SUB1. In this case, the thickness direction of the wiring substrate SUB1 means a direction (i.e., Z direction shown in FIG. 6) from one of the upper surface 2t and the lower surface 2b, which are shown in FIG. 6, toward the other.

For the wiring substrate SUB1, a portion of the signal wiring SGW (signal wiring SGW1) is routed in the wiring layer WL 1. However, in the wiring layer WL1, the region overlapping the portion LIDp2 of the heat radiating plate LID (area R1 in FIG. 7), the signal wiring SGW is not disposed. One of the reasons for this is as follows. As described with reference to FIG. 6, the portion LIDp2 of the heat radiating plate LID is a portion overlapping the adhesive layer BND1. In the wiring layer WL1, an organic insulating film SR1 is interposed (intervened) between the adhesive layer BN D1 and the wiring layer WL1. When repetitive thermal cycling loads are applied by using the semiconductor device PKG1, the stresses resulting from this load may cause cracks in a portion of the organic insulating film SR1 interposed between the adhesive layer BND1 and the wiring layer WL1. If the elongated wiring pattern is arranged at the crack generation point of the organic insulating film SR1, there is a possibility that a portion of the wiring pattern is broken. On the other hand, if the conductor pattern of a large area such as a ground plane is disposed at the crack generation point of the organic insulating film SR1, the conductor pattern of the large area is hardly damaged by the crack. Therefore, if the signal wiring SGW1 is not disposed in the area R1 overlapping the portion LIDp2 of the heat radiating plate LID as in the present embodiment, even when cracks occur in the organic insulating film SR1 described above can be prevented from damaging the signal wiring SGW1.

It is preferable not to place the signal wiring SGW1 in the region overlapping with the portion LIDp2 of the heat radiating plate LID, but in terms of preventing damage to the signal wiring SGW1 due to cracks, attempting to increase the number of signal transmission paths provided by one semiconductor device P KG1, the signal wiring SGW It needs to be routed to an area close to the periphery of the wiring substrate SUB 1. As shown in FIG. 4, the arrangement of the solder balls SB is an external terminal of semiconductor device PKG1 is because the closer to the outer periphery is more. Therefore, in the present embodiment, by placing the signal wiring WL2 in the wiring layer SGW2 and electrically connecting the signal wiring WL1 of the wiring layer SGW1, and the signal wiring SGW2 of the wiring layer SGW1, the signal transmission path to the vicinity of the peripheral portion of the wiring substrate SUB1 It has realized a structure.

Here, the signal wiring SGW1 disposed on the wiring layer WL1, and the signal wiring SGW2 disposed on the wiring layer WL2, the wiring structure differs from each other. For example, as shown in FIG. 8, the signal wiring SGW1 disposed on the wiring layer WL1, in the thickness direction of the wiring substrate SUB1, the ground plane is disposed on one side of the signal wiring SGW1, it is constituted by a so-called microstrip line structure. On the other hand, like the wiring substrate SUBc shown in FIG. 10 as an examined example, the signal wiring SGW2 disposed in the wiring layer WL2 may be a so-called strip line structure that ground planes GP1 or ground planes GP3 are disposed on both sides of the signal wiring SGW2 in the thickness direction of the wiring substrate SUBc. When comparing the microstrip line structure and the strip line structure, since more capacitive coupling occurs in the strip line structure, the characteristic impedance of the signal transmission path is likely to be low. For example, if the characteristic impedance of the signal wiring SGW1 formed in the wiring layer WL1 is 100Ω, the characteristic impedance of the signal wiring SGW2 formed in the wiring layer WL2 shown in FIG. 10 becomes about 80Ω. When the characteristic impedance has the different portions in the same signal transmission path, since the reflection occurs at the discontinuity of the characteristic impedance, the signal transmission efficiency becomes a cause to decrease.

To suppress the reflection of the signal as described above, it is required to reduce the difference in characteristic impedance between the signal wiring SGW1 of the wiring layer WL1 and the signal wiring SGW2 of the wiring layer WL2. As shown in FIG. 9, in case of the present embodiment, in the conductive pattern (e.g., ground plane GP1) of the wiring layer WL3 disposed in the vicinity of the signal wiring SGW of the wiring layer WL2, the opening portion GPH1 is formed along the extending direction of the signal wiring SGW2 of the wiring layer WL2. Since it is possible to reduce the capacitive coupling with regard to the wiring layer WL2 by forming the above opening portion GPH1, it is also possible to reduce the difference in characteristic impedance between the signal wiring SGW1 of the wiring layer WL1 and the signal wiring SGW2 of the wiring layer WL2.

Although not shown, for example, the ground plane GP3 formed on the wiring layer WL1 shown in FIG. 10, even when the opening along the extending direction of the signal wiring SGW2 of the wiring layer WL2 is formed, it is possible to reduce the characteristic impedance of the signal wiring SGW2 of the wiring layer WL2. However, for this method, when the number of signal lines SGW is increased, since there is a possibility that a portion of the ground plane GP3 formed on the wiring layer WL1 becomes an elongated pattern, cracks in the organic insulating film SR1 as described above occurs, the ground plane GP3 elongated portion may be damaged. The present embodiment is also preferable in that the ground plane GP3 formed in the region R1 of the interconnect layer WL1 can be prevented from being damaged.

The wiring structure of the wiring substrate SUB1 shown in FIGS. 7 to 9 can be expressed as follows. The wiring substrate SUB1 includes an insulating layer 2e1 (see FIGS. 8 and 9), formed on the insulating layer 2e1, and a ground plane (conductor pattern) GP1 to which the first potential (for the present embodiment, the reference potential VSS) is supplied. Further, the wiring substrate SUB1 is in contact with the ground plane GP1, and includes an insulating layer 2e2 (see FIGS. 8 and 9) formed on the insulating layer 2e1 so as to cover the ground plane GP1, and a signal wiring SGW2 formed on the insulating layer 2e2. Further, the wiring substrate SUB1 is in contact with the signal wiring SGW2, and includes an insulating layer 2e3 (see FIGS. 8 and 9) formed on the insulating layer 2e2 so as to cover the signal wiring SGW2, the signal wiring SGW1 electrically connected with each of the signal wiring SGW2 and the signal electrode Sx1 (see FIG. 7), and an organic insulating film SR1 (see FIGS. 8 and 9) contacted with the signal wiring SGW1 and formed on the insulating layer 2e3 so as to cover the signal wiring SGW1. As shown schematically in FIG. 7, a signal SG1 is to be transmitted onto the signal electrode Sx1. Each of the signal wiring SGW1 and the signal wiring SGW2 composes a transmission path of the signal SG1. The signal wiring SGW2 is arranged in the region (area) R1 overlapping with the portion LIDp2 (see FIG. 6) of the heat radiating plate LID (see FIG. 6), while the signal wiring SGW1 is not arranged in the region (area) R1 overlapping with the portion LIDp2 of the heat radiating plate LID. In a transparent plan view, the ground plane GP1 has the opening portion GPH1 located at a position overlapping with the signal wiring SGW2. The opening portion GPH1 is formed so as to extend in the extending direction of the signal wiring SGW2. That is, the opening portion GPH1 is formed so as to extend along the signal wiring SGW2.

Incidentally, in FIG. 7 shows an example in which the entire via land 2vL connected to the signal wiring SGW2 and the signal wiring SGW2 overlaps with the opening portion GPH1. In other words, in the example shown in FIG. 7, the entire signal wiring routing SGW2, in a transparent plan view, is located within the opening portion GPH1. As a modified example to FIG. 7, a portion of the signal wiring SGW2 may not overlap the opening portion GPH1. For example, most of the signal wiring SGW2 is overlapped with the opening portion GPH1, there is a case where a portion of the signal wiring SGW2 does not overlap the opening portion GPH1 due to the convenience of the wiring layout in the wiring layer WL3. However, from the viewpoint of matching the characteristic impedance of the entire signal wiring SGW2, as shown in FIG. 7, it is preferable that a whole of the signal wiring SGW2 is overlapped with the opening portion GPH1.

Prefered Embodiment of Wiring Structure

Hereinafter, a preferred embodiment of the signal wiring SGW shown in FIGS. 7 to 9. First, in the example shown in FIG. 7, the wiring width LW2 of the signal wiring SGW2 is narrower than the wiring width LW1 of the signal wiring SGW1. From the viewpoint of improving the reliability of signal transmission by reducing the risk of disconnection of the signal wiring SGW, etc., the wiring width LW2 of the signal wiring SGW2 and the wiring width LW1 of the signal wiring SGW1 are preferably 30 μm or more. However, the signal wiring SGW2 disposed in the wiring layer WL2, the characteristic impedance is likely to be a low value as described above. Therefore, the wiring width LW2 of the signal wiring SGW2, it is preferable to narrow as possible within the range that can ensure the reliability of the signal transmission. Therefore, in the example shown in FIG. 7 for example, the wiring width LW2 is 30 μm. On the other hand, if the wiring width LW1 of the signal wiring SGW1 is wider than 30 μm, the risk of disconnection is further reduced. Further, when the wiring width LW1 is larger than the wiring width LW2, the difference between the characteristic impedance of the signal wiring SGW1 and the characteristic impedance of the signal wiring SGW2 is reduced.

However, the wiring width LW1 of the signal wiring SGW1 is determined to match the value of the designed characteristic impedance of the signal transmission path. For example, if the designed characteristic impedance is 100Ω, the wiring width LW1 of the signal wiring SGW1 is determined so as to a value such that the characteristic impedance becomes 100Ω. If the above value is 30 μm, then the wiring width LW1 and the wiring width LW2 are set to 30 μm. On the other hand, when the value of the wiring width LW1 whose characteristic impedance becomes 100Ω is larger than 30 μm (for example, 31 μm or 32 μm), the characteristic impedance of the signal wiring SGW2 can be made close to 100Ω by setting the value of the wiring width LW2 to 30 μm which is smaller than the wiring width LW1.

Incidentally, from the viewpoint of improving the reliability of the signal transmission by reducing the disconnection risk or the like, the lower limit of the preferred wiring width was 30 μm. However, the lower limit of the wiring width may vary depending on the configuration material and the size of the wiring substrate SUB1. Therefore, the value of the wiring width LW2 is not limited to 30 μm.

Further, in the example shown in FIG. 7, the wiring length LL2 of the signal wiring SGW2 is less than the wiring length LL1 of the signal wiring SGW1. As described above, it is impossible to place the signal wiring SGW1 in the area R1 from the viewpoint of preventing damages to the signal wiring SGW1. Therefore, the signal wiring SGW2 is disposed at least in the region R1. On the other hand, even if the signal wiring SGW2 other than the region R1 is disposed, since the disconnection risk or the like does not occur, as a modified example, the wiring length LL2 of the signal wiring SGW1 may be longer than the wiring length LL1 of the signal wiring SGW2.

However, when the length of the signal wiring SGW2 is increased, the arrangement space of the conductor pattern (e.g., ground plane and the power supply plane) disposed in the wiring layer WL2 (see FIG. 9) is narrowed. Therefore, from the viewpoint of effectively utilizing the wiring layer WL1, it is preferable that the wiring length LL1 of the signal wiring SGW1 is greater than the wiring length LL2 of the signal wiring SGW2.

The wiring length LL2 is defined as follows. That is, both end portions of the signal wiring SGW2 are connected to the via lands 2vL, respectively. The wiring length LL2 is the path distance from the boundary between one end portion of the signal wiring SGW2 and one of the via lands 2vL to the boundary between the other end portion of the signal wiring SGW2 and the other of the via lands 2vL. For example, if the signal wiring SGW2 is not straight but curved, the wiring length LL2 defined as the path distance will be longer than for straight lines.

Similarly, the wiring length LL1 is defined as follows. That is, one end portion of the signal wiring SGW1 is connected to the via land 2vL, and the other end portion of the signal wiring SGW1 is connected to the pad 2PD shown in FIG. 6. The wiring length LL1 is the path distance from the boundary between one end portion of the signal wiring SGW1 and the via land 2vL to the boundary between the other end portion of the signal wiring SGW1 and the pad 2PD. For example, if the signal wiring SGW1 is not straight but curved, the wiring length LL1 defined as the path distance will be longer than for straight lines.

Further, in the example shown in FIG. 9, the wiring substrate SUB1 is formed on the insulating layer 2e3, and further includes a ground plane (conductor pattern) GP3 electrically connected to the ground plane (conductor pattern) GP1. The ground plane GP3 is arranged in the region R1 (see FIG. 7) overlapping with the portion LIDp2 of the heat radiating plate LID (see FIG. 6). The signal wiring SGW2 overlaps the ground plane GP1. By disposing the ground plane GP3 on top of the signal wiring SGW2, it is possible to suppress the electromagnetic wave generated when the signal current flows in the signal wiring SGW2 is diffused above the wiring substrate SUB1.

Further, in the example shown in FIG. 9, the wiring substrate SUB1 is formed on the insulating layer 2e2, and further includes a ground plane (conductor pattern) GP2 electrically connected to the ground plane (conductor pattern) GP1. In the wiring layer WL2, the ground plane GP2 is spaced from the signal wiring SGW2, and is disposed so as to sandwich the signal wiring SGW2. By placing the ground plane GP2 so as to sandwich the signal wiring SGW2, for example, even when a plurality of signal transmission paths in the wiring layer WL2 are densely arranged, it is possible to suppress the generation of crosstalk noise between the signal transmission paths.

Similarly, in case of the example shown in FIG. 8, the wiring substrate SUB1 is formed on the insulating layer 2e3, and further includes the ground plane (conductor pattern) GP3 electrically connected to the ground plane (conductor pattern) GP1. In the wiring layer WL1, the ground plane GP 3 is spaced apart from the signal wiring SGW1 and is disposed so as to sandwich the signal wiring SGW1. By placing the ground plane GP3 so as to sandwich the signal wiring SGW1, for example, even when a plurality of signal transmission paths in the wiring layer WL1 are densely arranged, it is possible to suppress the generation of crosstalk noise between the signal transmission paths.

<Relationship of Adjacent Signal Wirings>

Figure 11:
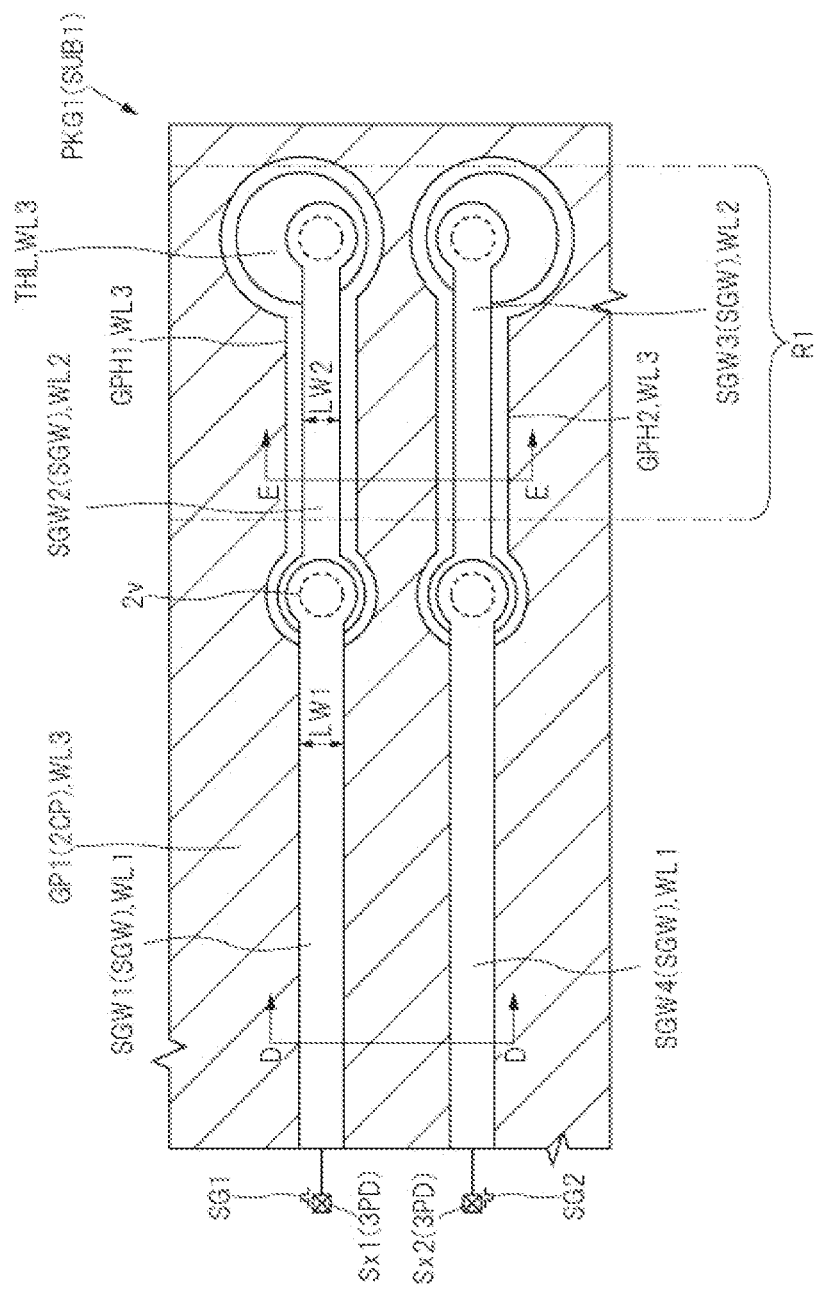
FIG. 11 is a transparent plan view showing a modified example with regard to FIG. 7.
Figure 12:
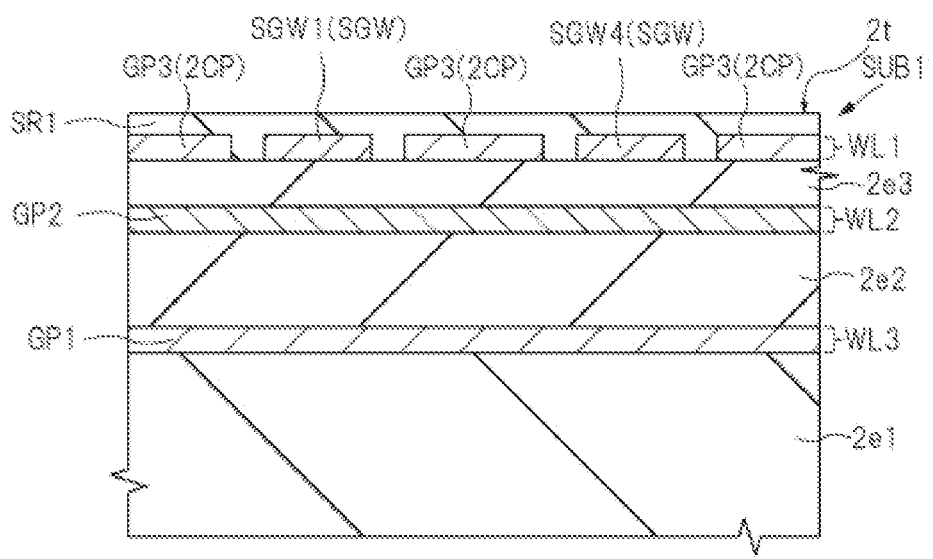
FIG. 12 is an enlarged cross-sectional view along line D-D shown in FIG. 11.
Figure 13:
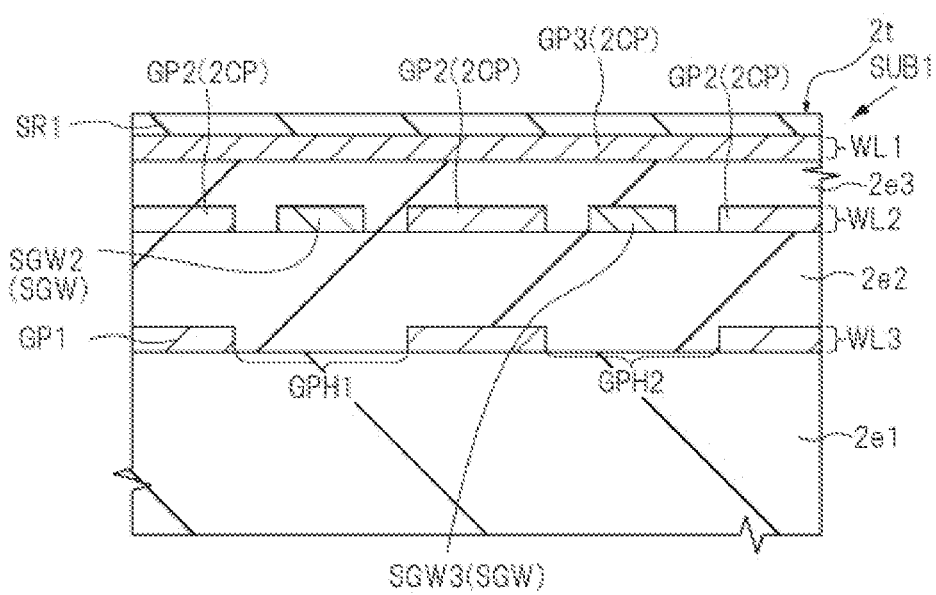
FIG. 13 is an enlarged cross-sectional view along line E-E shown in FIG. 11.

Next, an example in which a plurality of signal wiring is disposed in the same wiring layer will be described with reference to FIGS. 11 to 13. FIG. 11 is a transparent plan view showing a modified example with regard to FIG. 7. FIG. 12 is an enlarged cross-sectional view along line D-D shown in FIG. 11. FIG. 13 is an enlarged cross-sectional view along line E-E shown in FIG. 11. In FIG. 11, similarly to FIG. 7, the signal wiring SGW, the ground plane GP1 formed on the wiring layer WL3, and the through-hole land THL formed on the wiring layer WL3, other conductor patterns and insulating layers are not shown.

A plurality of electrodes 3PD arranged on the front surface 3t of the semiconductor chip CHP1 shown in FIG. 6 further includes a signal electrode Sx2 which is a transmission path of a signal SG2 as shown in FIG. 11. As shown in FIGS. 11-13, the wiring substrate SUB1 further includes a signal wiring SGW3 formed on the insulating layer 2e2 and arranged next to the signal wiring SGW2, and a signal wiring SGW4 formed on the insulating layer 2e3 and electrically connected to each of the signal wiring SGW3 and the signal electrode Sx2. Each of the signal wiring SGW3 and the signal wiring SGW4 composes a transmission path of the signal SG2. The signal wiring SGW3 is arranged in the region R1 (see FIG. 6) overlapping with the portion LIDp2 of the heat radiating plate LID (see FIG. 6), while the signal wiring SGW4 is not arranged in the region R1 overlapping with the portion LIDp2 of the heat radiating plate LID. The ground plane GP1 has an opening portion GPH2 located at a position overlapping with the signal wiring SGW3 in a transparent plan view. The opening portion GPH2 is formed so as to extend in the extending direction of the signal wiring SGW3. That is, the opening portion GPH2 is formed so as to extend along the signal wiring SGW3.

In the embodiment shown in FIG. 11, the signal SG1 and the signal SG2 are different signals that are independent of each other. Therefore, a signal transmission path including the signal wiring SGW2, it is required to reduce the crosstalk noise between the signal transmission path including the signal wiring SGW3. In order to reduce crosstalk noise between the signal routing SGW2 and the signal routing SGW3, as shown in FIG. 11, it is preferable that a part of the ground plane GP1 is interposed (intervened) between the opening portion GPH1 and the opening portion GPH2. Also, as shown in FIG. 13, in the wiring layer WL2, it is preferable that a part of the ground plane GP2 is interposed (intervened) between the signal wiring SGW2 and the signal wiring SGW3. Each of the ground plane GP1 and the ground plane GP2 functions (serves) as a shield to suppress the diffusion of electromagnetic waves.

Similarly, in order to reduce the crosstalk noise between the signal wiring SGW1 and the signal wiring SGW4 in the wiring layer WL1, as shown in FIG. 12, it is preferable that a part of the ground plane GP3 is interposed (intervened) between the signal wiring SGW1 and the signal wiring SGW4. Each of the ground plane GP3 and ground plane GP2 functions (serves) as a shield to suppress the diffusion of electromagnetic waves.

Although not shown, as a modified example with respect to FIG. 11, the opening portions GPH1 and GPH 2 may be connected to each other at a position away from the signal wiring SGW. However, from the viewpoint of preventing crosstalk noise, ideally, as shown in FIG. 11, it is particularly preferable that the opening GPH1 and the opening portion GPH2 are separated from each other via a part of the ground plane GP1.

In addition, similarly to the positional relationship between the signal wiring SGW2 and the opening portion GPH1, which are described with reference to FIG. 7, as a modified example to FIG. 11, a portion of the signal wiring SGW3 may not overlap with the opening portion GPH2. However, from the viewpoint of matching the characteristic impedance of the entire signal wiring SGW1 and the entire signal wiring SGW3, as shown in FIG. 11, it is preferable that the whole of the signal wiring SGW2 is overlapped with the opening portion GPH1, and the whole of the signal wiring SGW3 is overlapped with the opening portion GPH2. In other words, it is preferable that the whole of the signal wiring SGW2 is located within the opening portion GPH1 in a transparent plan view, and the whole of the signal wiring SGW3 is located within the opening portion GPH2 in a transparent plan view.

<Example of Signal Wiring Composing Differential Pair>

Figure 14:
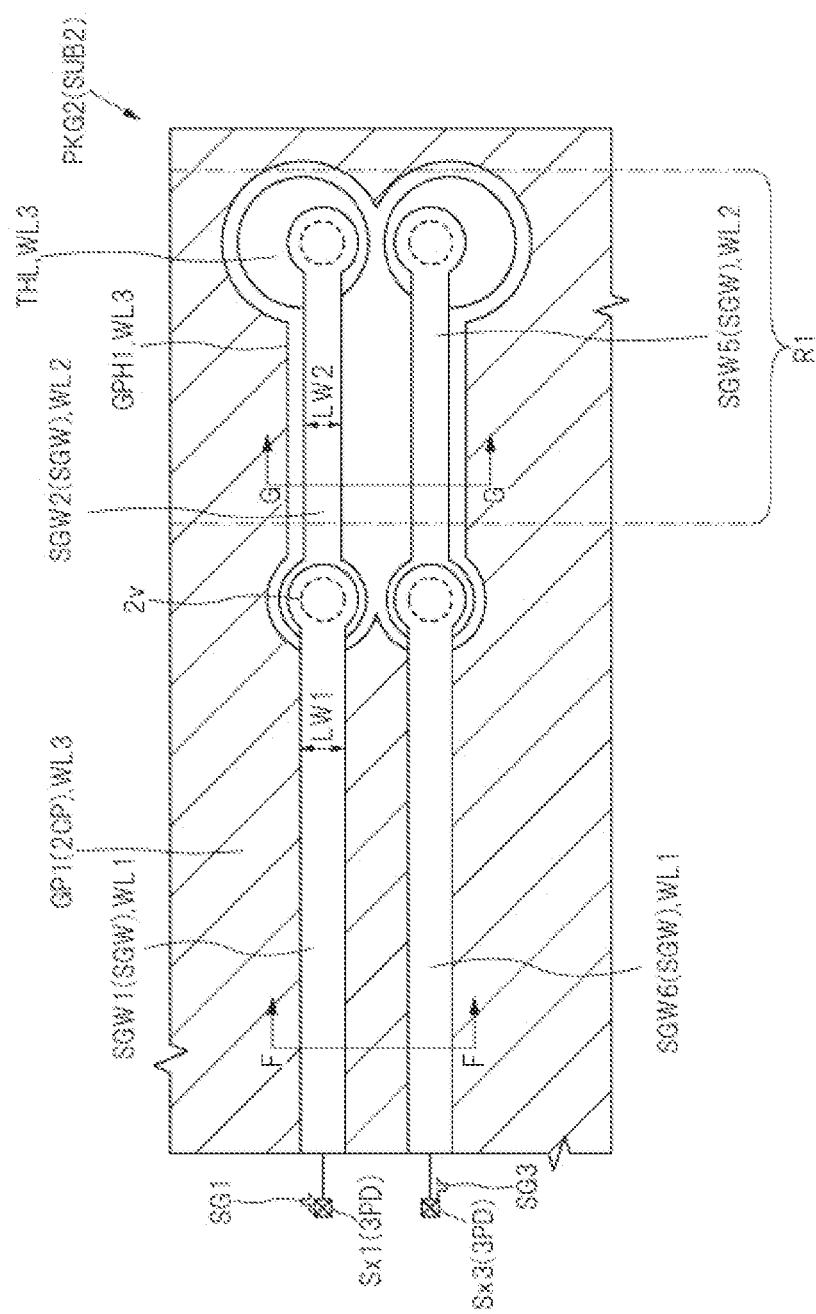
FIG. 14 is a transparent plan view showing another modified example with regard to FIG. 7.
Figure 15:
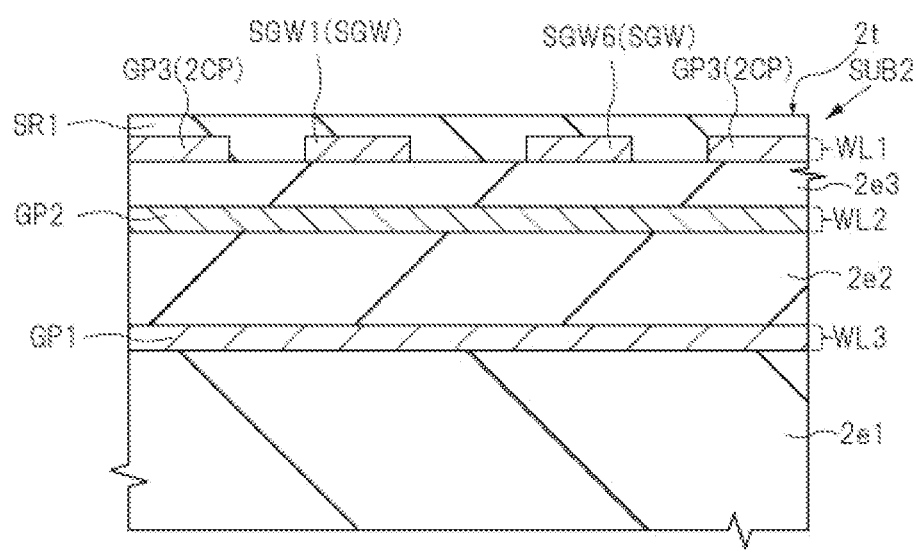
FIG. 15 is an enlarged cross-sectional view along line F-F shown in FIG. 14.
Figure 16:
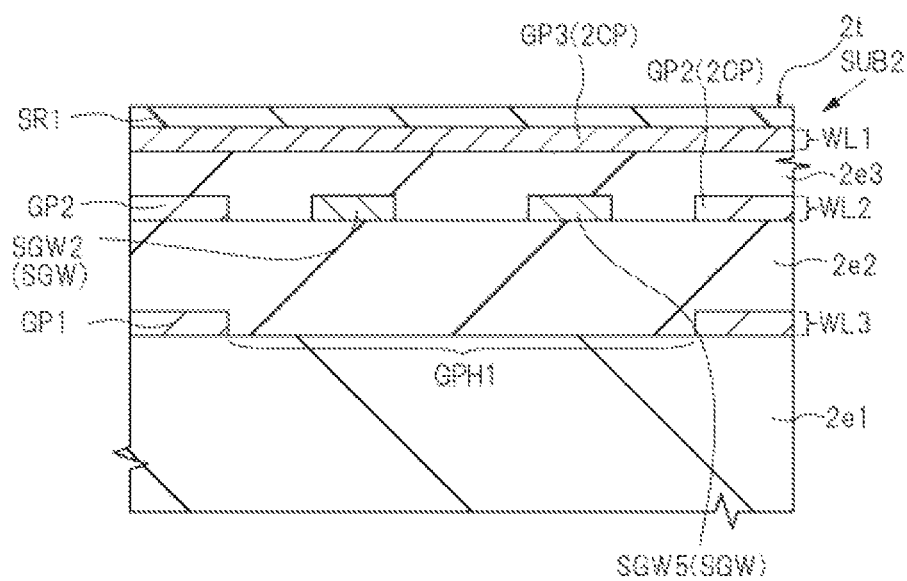
FIG. 16 is an enlarged cross-sectional view along line G-G shown in FIG. 14.

Next, an example of applying to the signal wiring composing the differential pair will be described with reference to FIGS. 14 to 16. FIG. 14 is a transparent plan view showing another modified example with regard to FIG. 7. FIG. 15 is an enlarged cross-sectional view along line F-F shown in FIG. 14. FIG. 16 is an enlarged cross-sectional view along line G-G shown in FIG. 14. In FIG. 14, similarly to FIG. 7, the signal wiring SGW, the ground plane GP1 formed on the wiring layer WL3, and except for the through-hole lands THL formed on the wiring layer WL3, other conductor patterns and insulating layers are not shown. The semiconductor device PKG2 shown in FIG. 14 is the same as the semiconductor device PKG1 shown in FIG. 7 for the difference described below.

A plurality of electrodes 3PD arranged on the front surface 3t of the semiconductor chip CHP1 shown in FIG. 6 further includes a signal electrode Sx3 which is a transmission path of a signal SG3 as shown in FIG. 14. The transmission path of the signal SG1 and the transmission path of the signal SG3 compose a differential pair. In other words, the signal SG1 and the signal SG3 compose a differential signal.

As shown in FIGS. 14 to 16, the wiring substrate SUB1 is formed on the insulating layer 2e2, and further includes a signal wiring SGW5 arranged next to the signal wiring SGW2, and a signal wiring SGW6 formed on the insulating layer 2e3 and electrically connected to each of the signal wiring SGW5 and the signal electrode Sx3. Each of the signal wiring SGW5 and the signal wiring SGW6 composes a transmission path of the signal SG3. The signal wiring SGW5 is arranged in the region R1 overlapping with the portion LIDp2 (see FIG. 6) of the heat radiating plate LID (see FIG. 6), while the signal wiring SGW6 is not arranged in the region R1 overlapping with the portion LIDp2 of the heat radiating plate LID. In a transparent plan view, the opening portion GPH1 of the ground plane GP1 is formed at a position overlapping with each of the signal wiring SGW2 and the signal wiring SG W5, and is formed so as to extend in the extending direction of the signal wiring SGW2 and the signal wiring SGW5. Incidentally, since the signal wiring SGW2 and the signal wiring SGW5 composes a differential pair, both are extending in the same direction adjacent to each other.

As shown in FIG. 15, when the signal wiring SGW1 and the signal wiring SGW6 compose a differential pair, the ground plane GP3 is not arranged between the signal wiring SGW1 and the signal wiring SGW6. Similarly, as shown in FIG. 16, when the signal wiring SGW2 and the signal wiring SGW5 compose a differential pair, the ground plane GP2 is not arranged between the signal wiring SGW2 and the signal wiring SGW5. In this case, in the wiring layer WL3, it is not necessary to provide independent openings at each of a position overlapping with the signal wiring SGW2 in a transparent plan view and a position overlapping with the signal wiring SGW5 in a transparent plan view. That is, it is preferable that one opening portion GPH1 is formed so as to overlap with each of the signal wiring SGW2 and the signal wiring SGW5.

Although not shown, when provided with a plurality of differential pairs as a signal transmission path, similarly to the example described with reference to FIGS. 11 to 13, a part of each of the ground plane GP3 (see FIG. 12) and the ground plane GP2 (see FIG. 13) is interposed (intervened) between adjacent differential pairs. The opening portion GPH1 shown in FIG. 14 is preferably formed for each differential pair.

In addition, similarly to the positional relationship between the signal wiring SGW2 and the opening portion GPH1, which are described with reference to FIG. 7, as a modified example to FIG. 14, a portion of the signal wiring SGW5 may not overlap with the opening portion GPH1. However, from the viewpoint of matching the characteristic impedance of the entire signal wiring SGW1 and the signal wiring SGW5, as shown in FIG. 14, the signal wiring SGW1 and the entire signal wiring SGW5 is preferably overlapped with the opening portion GPH1. In other words, in a transparent plan view, the whole of the signal wiring SGW5 is preferably located within the opening portion GPH1.

<Modified Example Using Heat Radiating Plate as Shield>

Figure 17:
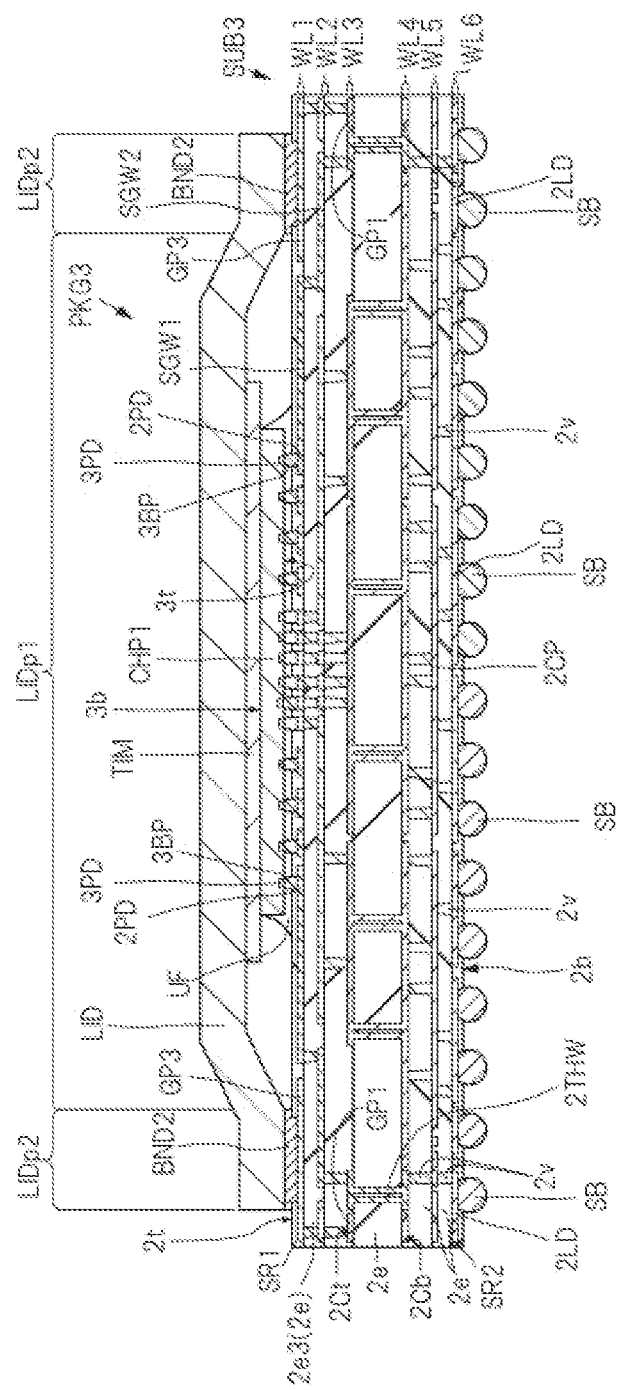
FIG. 17 is an explanatory view showing a modified example with regard to FIG. 6.
Figure 18:
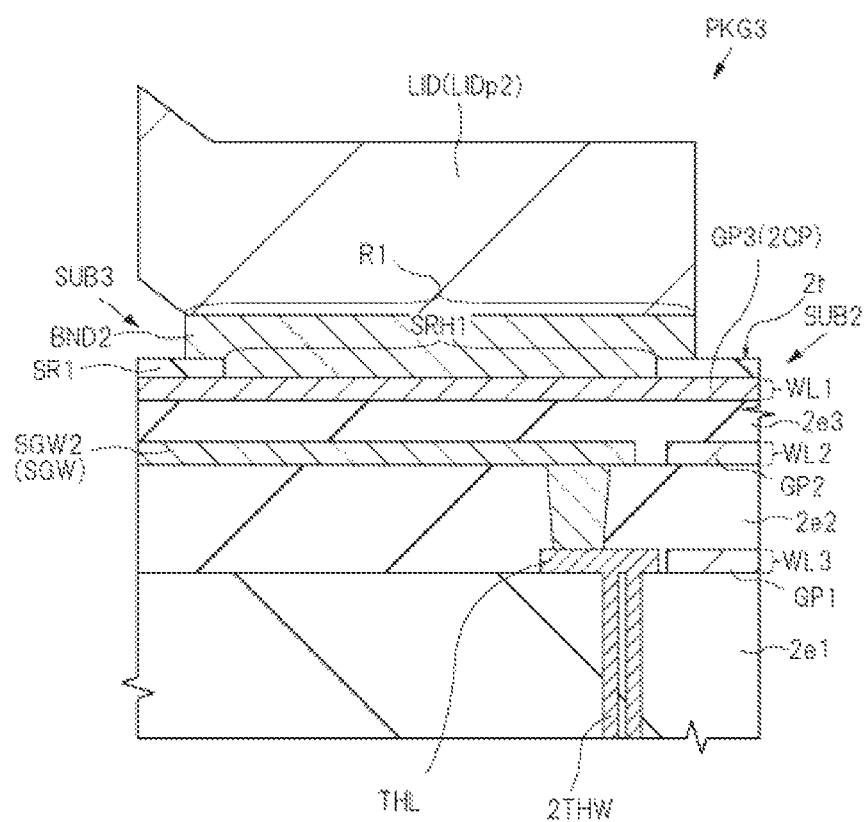
FIG. 18 is an enlarged cross-sectional view at a connecting portion between a ground plane and the heat radiating plate shown in FIG. 17.

Next, as a modified example of the semiconductor device PKG1 and the semiconductor device PKG2 shown in FIG. 6, a modified example for utilizing the heat radiating plate LID as electromagnetic wave shielding will be described below. FIG. 17 is an explanatory view showing a modified example with regard to FIG. 6. FIG. 18 is an enlarged cross-sectional view at a connecting portion between a ground plane and the heat radiating plate shown in FIG. 17.

The wiring substrate SUB3 composing the semiconductor device PKG3 shown in FIG. 17 comprises a wiring substrate SUB1 shown in FIGS. 9 and 13, and has, similarly to the wiring substrate SUB2 shown in FIG. 16, a ground plane GP3 formed on the insulating layer 2e3 and electrically connected to the ground plane GP1. The ground plane GP3 is arranged in the region R1 overlapping with the portion LIDp2 of the heat radiating plate LID (see FIG. 18). The signal wiring SGW2 overlaps the ground plane GP3. This point is similar to the wiring substrate SUB1 described with reference to FIG. 9.

In case of the wiring substrate SUB3, the heat radiating plate LID is made of metal, and the heat radiating plate LID is electrically connected to the ground plane (conductor pattern) GP3 through the adhesive layer BND2 having a conductivity. Specifically, as shown in FIG. 18, in the region R1 overlapping with the portion LIDp2 of the heat radiating plate LID, the opening portion SRH1 is formed in the organic insulating film SR1. The adhesive layer BND 2 is, for example, a so-called conductive resin in which a large number of conductive particles are mixed in a solder or a thermosetting resin. The adhesive layer BND2 is bonded to the ground plane GP3 in the opening portion SRH1 formed in the organic insulating layer SR1. Also, the adhesive layer BND2 is bonded to the portion LIDp2 of the heat radiating plate LID.

In case of the semiconductor device PKG3, by electrically connecting the heat radiating plate LID and the ground plane GP3 with each other, a fixed potential (e.g., a reference potential) is to be supplied to the heat radiating plate LID. In this case, the heat radiating plate LID functions as an electromagnetic wave shield to suppress that the electromagnetic wave generated in the wiring path of the wiring substrate SUB3 is diffused upward of the semiconductor device PKG3.

The present modified example is particularly useful for a semiconductor device that are incorporated in an electronic device that require high performance for electromagnetic noise reduction, such as radio communication modules.

The opening portion SRH1 shown in FIG. 18 may be formed in at least one position in the region R1 shown in FIG. 5. However, from the viewpoint of stabilizing the potential supplied to the heat radiating plate LID, it is preferable that the opening portion SRH1 is formed at a plurality of positions in the region R1. It is particularly preferable that the opening portion SRH1 has a frame shape following the shape of the region R1.

The semiconductor device PKG3 shown in FIGS. 17 and 18 is the same as the semiconductor device PKG1 and the semiconductor device PKG2 described above, except for the above-mentioned differences. Therefore, duplicate descriptions are omitted.

In the above-mentioned embodiments and the descriptions of the above-mentioned modified examples, the ground plane GP1, the ground plane GP2, and the ground plane GP3 may be conductor patterns of a large area to which some fixed potential is to be supplied. Therefore, for example, each plane may be a power supply plane to which a power supply potential other than the reference potential is to be supplied. As a conceptual including a ground plane and a power plane, it can also be read as a conductor pattern to which a fixed potential is supplied.

Further, in the above description, mainly a method of controlling the impedance in the signal wiring SGW. However, as a modified example, for example, it can be applied in conjunction with a method of controlling the impedance at other portions, such as through-hole lands THL shown in FIG. 7. For example, as a method of reducing the capacitive coupling to the through-hole land THL in the example shown in FIG. 7, in the wiring layer WL1 (see FIG. 6), there is a case where the opening portion is formed at a position, which is overlapping the through-hole lands THL, of the conductor pattern 2CP (see FIG. 6).

Although the invention made by the present inventor has been specifically described based on the embodiment, the present invention is not limited to the above embodiment, and it is needless to say that various modifications can be made without departing from the gist thereof.

What is claimed is:

1. A semiconductor device comprising:
    a semiconductor chip having a first surface on which a first electrode is arranged, the first electrode being a transmission path of a first signal;
    a wiring substrate having a second surface facing the first surface of the semiconductor chip; and
    a heat radiating plate disposed on the wiring substrate such that the semiconductor chip is covered with the heat radiating plate,
    wherein the heat radiating plate has:
        a first portion including a portion overlapping with the semiconductor chip; and
        a second portion arranged around the first portion and bonded to the wiring substrate via an adhesive layer,
    wherein the wiring substrate includes:
        a first insulating layer;
        a first conductive pattern formed on the first insulating layer and to which a first potential is to be supplied;
        a second insulating layer contacted with the first conductive pattern and formed on the first insulating layer such that the first conductive pattern is covered with the second insulating layer;
        a first signal wiring formed on the second insulating layer;
        a third insulating layer contacted with the first signal wiring and formed on the second insulating layer such that the first signal wiring is covered with the third insulating layer;
        a second signal wiring formed on the third insulating layer and electrically connected with each of the first signal wiring and the first electrode; and
        an organic insulating film contacted with the second signal wiring and formed on the third insulating layer such that the second signal wiring is covered with the organic insulating film,
    wherein the first signal wiring is arranged in a region overlapping with the second portion of the heat radiating plate,
    wherein the second signal wiring is not arranged in the region overlapping with the second portion of the heat radiating plate,
    wherein the first conductive pattern has a first opening portion located at a position overlapping with the first signal wiring, and
    wherein the first opening portion is formed so as to extend along the first signal wiring.

2. The semiconductor device according to claim 1, wherein a wiring width of the first signal wiring is smaller than a wiring width of the second signal wiring.

3. The semiconductor device according to claim 1, wherein a wiring length of the first signal wiring is less than a wiring length of the second signal wiring.

4. The semiconductor device according to claim 1,
    wherein the semiconductor chip further has a second electrode arranged on the first surface, the second electrode being a transmission path of a second signal,
    wherein the wiring substrate further includes:
        a third signal wiring formed on the second insulating layer and formed next to the first signal wiring; and
        a fourth signal wiring formed on the third insulating layer and electrically connected with each of the third signal wiring and the second electrode, wherein the third signal wiring is arranged in the region overlapping with the second portion of the heat radiating plate, wherein the fourth signal wiring is not arranged in the region overlapping with the second portion of the heat radiating plate, wherein the first conductive pattern has a second opening portion located at a position overlapping with the third signal wiring, and wherein the second opening portion is formed so as to extend along the third signal wiring.

5. The semiconductor device according to claim 4, wherein a part of the first conductive pattern is intervened between the first opening portion and the second opening portion.

6. The semiconductor device according to claim 5, wherein the first opening portion and the second opening portion are separated from each other via the part of the first conductive pattern.

7. The semiconductor device according to claim 1, wherein the semiconductor chip further has a second electrode arranged on the first surface, the second electrode being a transmission path of a third signal, wherein the transmission path of the first signal and the transmission path of the third signal compose a differential pair, wherein the wiring substrate further includes:
   a fifth signal wiring formed on the second insulating layer and formed next to the first signal wiring; and
   a sixth signal wiring formed on the third insulating layer and electrically connected with each of the fifth signal wiring and the second electrode, wherein the fifth signal wiring is arranged in the region overlapping with the second portion of the heat radiating plate, wherein the sixth signal wiring is not arranged in the region overlapping with the second portion of the heat radiating plate, wherein the first opening portion of the first conductive pattern is located at the position overlapping with both the first signal wiring and the fifth signal wiring, and wherein the first opening portion is formed so as to extend along both the first signal wiring and the fifth signal wiring.

8. The semiconductor device according to claim 1, wherein the wiring substrate further includes:
   a second conductive pattern formed on the third insulating layer and electrically connected with the first conductive pattern, wherein the second conductive pattern is arranged in the region overlapping with the second portion of the heat radiating plate, and wherein, in plan view, the first signal wiring is overlapped with the second conductive pattern.

9. The semiconductor device according to claim 8, wherein the heat radiating plate is made of a metal, and wherein the heat radiating plate is electrically connected with the second conductive pattern via the adhesive layer having a conductivity.

10. The semiconductor device according to claim 1, wherein a whole of the first signal wiring is overlapped with the first opening portion.

* * * * *